United States Patent
Lin

(10) Patent No.: US 11,296,696 B2
(45) Date of Patent: Apr. 5, 2022

(54) DETECTION APPARATUS AND DETECTION METHOD THEREOF

(71) Applicant: Industrial Technology Research Institute, Hsinchu (TW)

(72) Inventor: Hsuan-Yu Lin, Changhua County (TW)

(73) Assignee: Industrial Technology Research Institute, Hsinchu (TW)

(*) Notice: Subject to any disclaimer, the term of this patent is extended or adjusted under 35 U.S.C. 154(b) by 328 days.

(21) Appl. No.: 16/727,851

(22) Filed: Dec. 26, 2019

(65) Prior Publication Data
US 2020/0212911 A1  Jul. 2, 2020

(30) Foreign Application Priority Data
Dec. 28, 2018 (TW) .................. 107147686

(51) Int. Cl.
H03K 17/96 (2006.01)
G06F 3/044 (2006.01)
G06F 3/045 (2006.01)

(52) U.S. Cl.
CPC ......... *H03K 17/9645* (2013.01); *G06F 3/045* (2013.01); *G06F 3/0445* (2019.05); *H03K 17/962* (2013.01); *G06F 2203/04106* (2013.01)

(58) Field of Classification Search
CPC .............. H03K 17/9645; H03K 17/962; G06F 3/0445; G06F 3/045; G06F 2203/04106
See application file for complete search history.

(56) References Cited

U.S. PATENT DOCUMENTS

| | | | |
|---|---|---|---|
| 8,729,905 B2 | 5/2014 | McCormack et al. | |
| 2006/0181283 A1* | 8/2006 | Wajcer | H04B 3/46 324/539 |

(Continued)

FOREIGN PATENT DOCUMENTS

| | | |
|---|---|---|
| CN | 105205436 | 12/2015 |
| TW | 201411103 | 3/2014 |
| TW | I613441 | 2/2018 |

OTHER PUBLICATIONS

Nobuyuki Futai et al., "A flexible micromachined planar spiral inductor for use as an artificial tactile mechanoreceptor," Sensors and Actuators A: Physical, vol. 111, Issue 2-3, Mar. 15, 2004, pp. 293-303.

(Continued)

*Primary Examiner* — Alexander Eisen
*Assistant Examiner* — Nathaniel P Brittingham
(74) *Attorney, Agent, or Firm* — JCIPRNET

(57) ABSTRACT

A detection apparatus and a detecting method thereof are provided. In the method, an input impedance structure, a sensing impedance structure and an output impedance structure are provided. The sensing impedance structure is connected to the input impedance structure. At least two impedances are formed in the sensing impedance structure. The output impedance structure is connected to the sensing impedance structure. At least three discontinuous impedance surfaces are formed in the input impedance structure, the sensing impedance structure and the output impedance structure. A detection signal is inputted into the input impedance structure, and the detection signal passes through the three impedance structures. Then, a variation of at least one of the discontinuous impedance surfaces can be determined according to the outputted detection signal from the output impedance structure.

15 Claims, 6 Drawing Sheets

(56) References Cited

U.S. PATENT DOCUMENTS

| | | | |
|---|---|---|---|
| 2010/0283479 A1 | 11/2010 | McCormack et al. | |
| 2011/0128257 A1* | 6/2011 | Kim | G06F 3/0446 345/175 |
| 2018/0024184 A1* | 1/2018 | Sallem | G01R 31/11 324/527 |

OTHER PUBLICATIONS

Daniel Xu et al., "Stretch not flex: programmable rubber keyboard," Smart Materials and Structures, vol. 25, Issue 1, Nov. 24, 2015, pp. 015012/1-015012/7.

Yang Zhang et al., "Electrick Low-Cost Touch Sensing Using Electric Field Tomography," CHI '17 Proceedings of the 2017 CHI Conference on Human Factors in Computing Systems, May 6, 2017, pp. 1-14.

"Office Action of Taiwan Counterpart Application," dated Sep. 19, 2019, p. 1-p. 6.

\* cited by examiner

DETECTION APPARATUS AND DETECTION METHOD THEREOF

CROSS-REFERENCE TO RELATED APPLICATION

This application claims the priority benefits of Taiwan application serial no. 107147686, filed on Dec. 28, 2018. The entirety of the above-mentioned patent application is hereby incorporated by reference herein.

TECHNICAL FIELD

The disclosure relates to a detection apparatus and a detection method thereof.

BACKGROUND

Multi-point sensors or array sensors have been widely used in technical fields such as touch, electronic skin, pressure sensing, electromagnetic field sensing, and distance sensing. In the design of existing multi-point or array sensors, many wires are required to send or receive signals. For example, a programmable rubber keyboard uses a Resistor Capacitor (RC) circuit to determine the difference in response of different frequency signals, and a two-layer soft sensor with co-grounding may be used to design a two-axis soft pressure sensor. Soft stress sensors with high resolution (for example, more than a certain number of sensors are arranged in per unit area) may also use RC circuits to derive the difference in response of different frequency signals. Electrick is configured to connect the electrodes around the object sprayed with conductive spray, and uses the current shunt and phase delay principle to determine the touch position. Radio Frequency (RF) based gesture input devices use Time Domain Reflectometry (TDR) to measure gestures. If the application of miniaturization and softness or flexibility is further taken into consideration, multi-point sensor or array sensor will encounter problems such as size and hardness. It can be seen that simplifying the circuit for sensors is one of the important issues to be solved.

SUMMARY

The detection method of the embodiment of the present disclosure includes the following steps. An input impedance structure is provided. A sensing impedance structure is provided. The sensing impedance structure is connected to the input impedance structure, and at least two impedances are formed in the sensing impedance structure. An output impedance structure is provided. The output impedance structure is connected to the sensing impedance structure, and at least three discontinuous impedance surfaces are formed in the input impedance structure, the sensing impedance structure, and the output impedance structure. The detection signal is input to the input impedance structure, so that the detection signal passes through the input impedance structure, the sensing impedance structure, and the output impedance structure. A variation of at least one of the discontinuous impedance surfaces can be determined according to the detection signal outputted by the output impedance structure.

The detection apparatus in the embodiment of the present disclosure includes an input impedance structure, a sensing impedance structure, an output impedance structure, a signal generator, and a processor. The sensing impedance structure is connected to the input impedance structure, and two impedances are formed in the sensing impedance structure. The output impedance structure is connected to the sensing impedance structure, and at least three discontinuous impedance surfaces are formed by the input impedance structure, the sensing impedance structure, and the output impedance structure. The signal generator is connected to the input impedance structure, and the detection signal is input to the input impedance structure, so that the detection signal passes through the input impedance structure, the sensing impedance structure, and the output impedance structure. The processor determines the variation of at least one of the discontinuous impedance surfaces according to the detection signal outputted by the output impedance structure.

Several exemplary embodiments accompanied with figures are described in detail below to further describe the disclosure in details.

DESCRIPTION OF EMBODIMENTS

Figure 1:
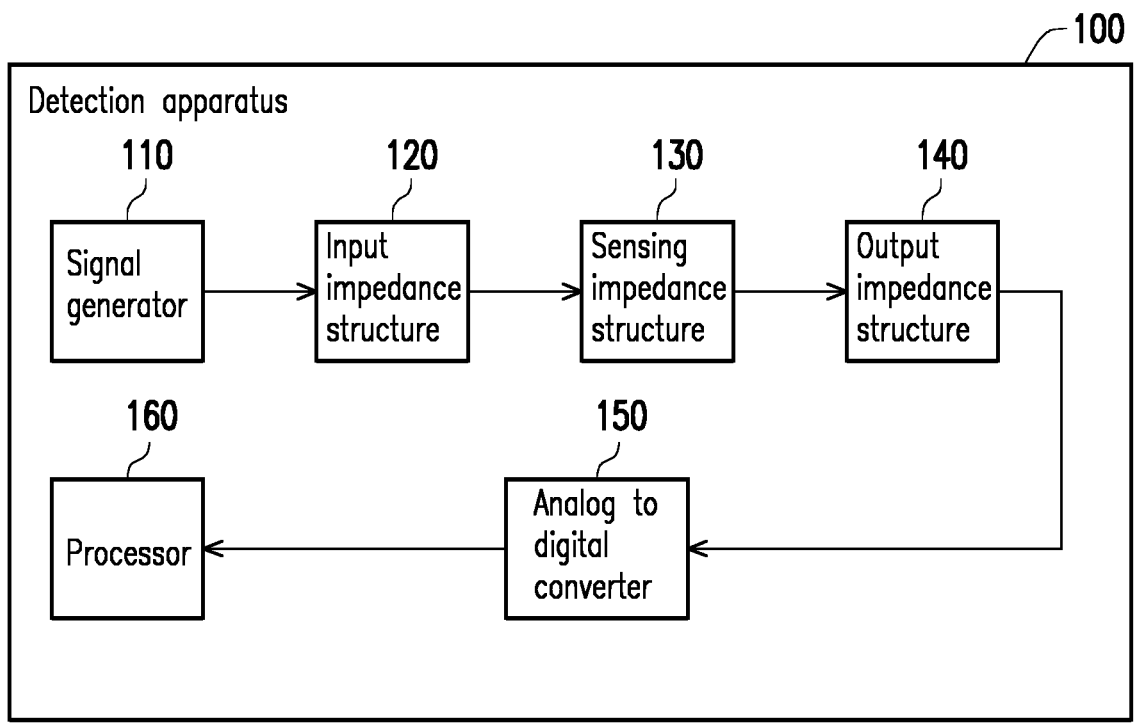
FIG. 1 is a block diagram of components of a detection apparatus according to an embodiment of the present disclosure.

FIG. 1 is a block diagram of components of a detection apparatus 100 according to an embodiment of the present disclosure. Referring to FIG. 1, the detection apparatus 100 includes, but is not limited to, a signal generator 110, an input impedance structure 120, a sensing impedance structure 130, an output impedance structure 140, an analog to digital converter 150, and a processor 160. Among them, the analog to digital converter 150 may be selectively configured according to requirements of design. The detection apparatus 100 may be applied to sensing of touch, softness, pressure, distance, etc., Virtual Reality (VR)/Augmented Reality (AR)/Mixed Reality (MR), or mechanical arm sensing, biological signal detection and other fields.

The signal generator 110 is used to output mechanical wave signals such as surface acoustic waves (SAW), pure acoustic waves, or non-mechanical wave signals such as light waves, electric waves, or magnetic waves.

The input impedance structure 120 and the output impedance structure 140 may be equivalent circuits formed by at least one of a resistor, a capacitor, and an inductor. For example, the signal generator 110 may form the input impedance structure 120 with the connection wire. The wire forms an output impedance structure 140.

Figure 2:
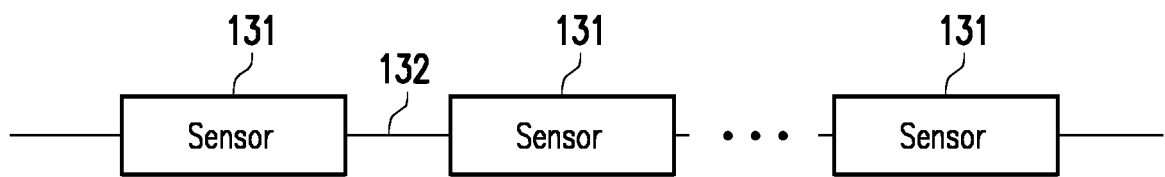
FIG. 2 is a schematic view of a sensing impedance structure according to an embodiment of the present disclosure.

The sensing impedance structure 130 may also be an equivalent circuit formed by at least one of a resistor, a capacitor, and an inductor. FIG. 2 is a schematic view of a sensing impedance structure 130 according to an embodiment of the present disclosure. Referring to FIG. 2, the sensing impedance structure 130 includes at least but not limited to a plurality of sensors 131 and a connection wire 132 for connecting adjacent sensors 131. The sensor 131 can be various types of sensors such as pressure sensor, softness sensor, and touch sensor. Two ends of the sensing impedance structure 130 are connected to the input impedance structure 120 and the output impedance structure 140, respectively. These sensors 131 may be connected in series through the connection wire 132 (e.g., cable, signal wire, circuit trace, etc.). That is, each of the sensors 131 is only connected to another adjacent sensor 131, an adjacent input impedance structure 120 or an adjacent output impedance structure 140, and each of the sensors 131 is at least connected to another sensor 131 (may through the connection wire 132). According to different design requirements, in other embodiments, the sensors 131 may also be directly connected to each other without the connection wire 132. In addition, the embodiment of the present disclosure provides no limitation to the shape or array formed by the plurality of sensors 131, and the arrangement position of the sensor 131 may be adjusted depending on the user's need.

In an embodiment, at least two impedances may be formed by the sensing impedance structure 130. For example, the sensing impedance structure 130 at least has two sensors 131. In addition, the impedance value of sensor 131 is different from the impedance value of an adjacent path (formed by connection wire 132) or another adjacent sensor 131. On the other hand, at least one impedance is formed by the input impedance structure 120 and the output impedance structure 140 respectively.

Figure 3:
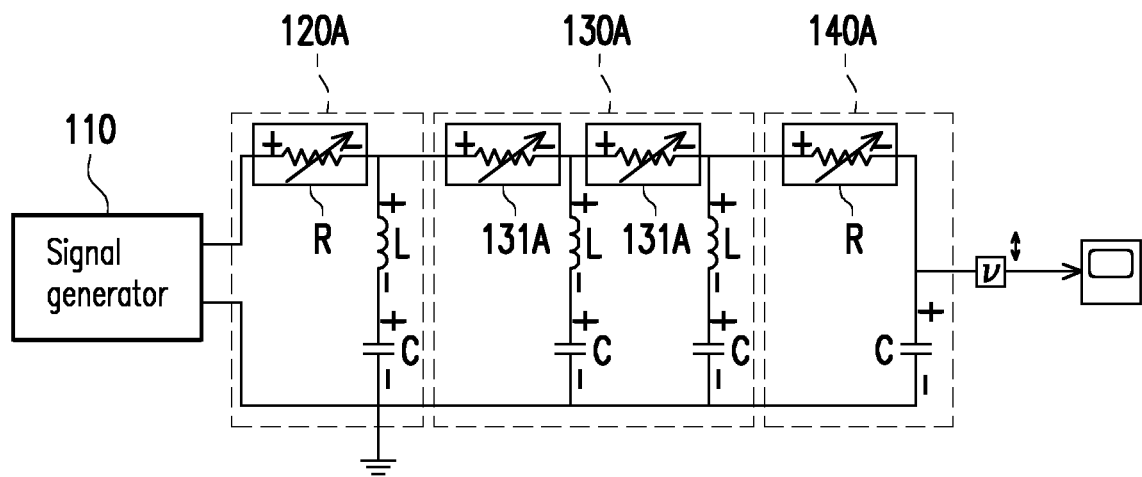
FIG. 3 is a schematic view of an equivalent circuit of three impedance structures according to an embodiment of the present disclosure.

FIG. 3 is a schematic view of an equivalent circuit of three impedance structures according to an embodiment of the present disclosure. Referring to FIG. 3, the input impedance structure 120A is formed by an RLC series circuit consisting of a variable resistor R, an inductor L, and a capacitor C. Each of the sensors 131A is equivalent to a variable resistor, and the sensing impedance structure 130A is formed by two sets of RLC series circuits connected in parallel consisting of the variable resistor R, the inductor L (adjustable to match sensor 131A) and the capacitor C, respectively. The output impedance structure 140A is formed by an RC series circuit consisting of the variable resistor R and the capacitor C. The signal generator 110 outputs a voltage signal.

Figure 4:
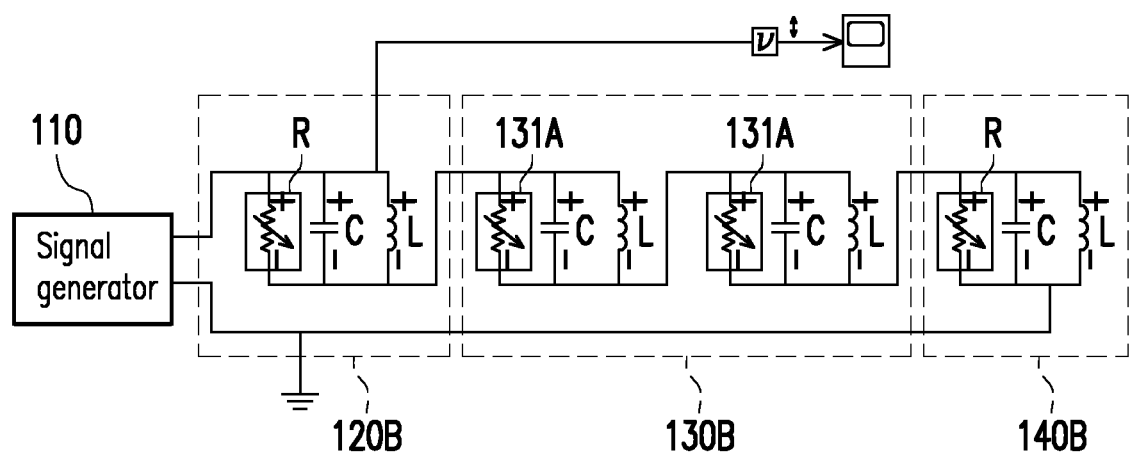
FIG. 4 is a schematic view of an equivalent circuit of three impedance structures according to an embodiment of the present disclosure.

FIG. 4 is a schematic view of an equivalent circuit of three impedance structures according to an embodiment of the present disclosure. Referring to FIG. 4, the difference between FIG. 4 and the embodiment of FIG. 3 is that the input impedance structure 120B and the output impedance structure 140B are formed by an RLC parallel circuit consisting of the variable resistor R, the inductor L and the capacitor C. The sensing impedance structure 130B is formed by two sets of RLC parallel circuits connected in series consisting of the variable resistor R, the inductor L (adjustable to match sensor 131A) and the capacitor C, respectively, and the signal generator 110 outputs a current signal. In addition, the embodiment of FIG. 3 measures the amplitude or phase of the output signal at the output of the last set (the rightmost side of the figure) of RLC series circuit, whereas the embodiment of FIG. 4 measures the amplitude or phase of the output signal (i.e., obtained by measuring the output signal of input impedance structure 120B) at the output end of the first set (RLC circuit at leftmost side in the figure) of the RLC parallel circuit.

Figure 5:
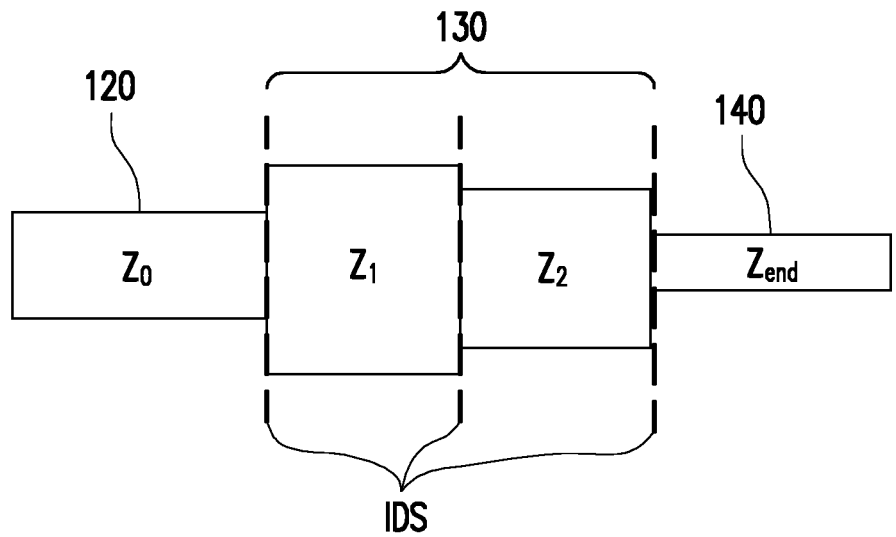
FIG. 5 is a schematic view of a discontinuous impedance surface according to an embodiment of the present disclosure.

FIG. 5 is a schematic view of a discontinuous impedance surface according to an embodiment of the present disclosure. Referring to FIG. 5, it is assumed that an impedance $Z_0$ is formed in the input impedance structure 120, and an impedance $Z_{end}$ is formed in the output impedance structure 140, and two impedances $Z_1$, $Z_2$ are formed in the sensing impedance structure 130. The impedance values of the impedance $Z_1$, $Z_2$ formed in the sensing impedance structure 130 are also different from the impedance $Z_0$, $Z_{end}$ formed in the adjacent input impedance structure 120 and the output impedance structure 140. Three discontinuous impedance surfaces IDS are formed between the impedances $Z_0 \sim Z_{end}$. That is, a discontinuous impedance surface IDS is formed between two adjacent different impedances. According to different requirements of design, in other embodiments, the number of impedance and discontinuous impedance surface may change. For example, if the sensing impedance structure 130 includes M impedances (M is a positive integer), then M+1 discontinuous impedance surface are formed, and so on, and the rest are not described again. In other words, the input impedance structure 120, the sensing impedance structure 130, and the output impedance structure 140 of the embodiment of the present disclosure are serially connected through adjacent impedances with different impedance values, and there is no need to add additional connection wire 132 for each of the sensors 131 in the sensing impedance structure 130 to be connected to other electronic components (e.g., signal generator 110, digital to analog converter 150, etc.). By serially connection, circuit traces or wires may be greatly simplified.

The analog to digital converter 150 is coupled to the input impedance structure 120 or the output impedance structure 140, the analog to digital converter 150 is configured to convert the analog signal into a digital signal (e.g., converting the analog signal sent by the signal generator 110 into a digital format). The processor 160 is coupled the analog to digital converter 150 and is configured to process digital signals and to execute a procedure in the exemplary embodiments of the disclosure. The function of the processor 160 may be implemented by using a programmable unit such as a central processing unit (CPU), a microprocessor, a microcontroller, a digital signal processing (DSP) chip, a field programmable gate array (FPGA) and so on. The function of the processor 160 may also be implemented by using a separate electronic device or an integrated circuit (IC), and the operation of the processor 160 may also be implemented by software.

In order to facilitate the understanding of the operation flow of the embodiment of the present disclosure, the operation flow of the detection apparatus 100 in the embodiment of the present disclosure will be described in detail below. Hereinafter, the method described in the embodiments of the present disclosure will be described with reference to various components of the detection application 100. The various processes of the method may be adjusted depending on the implementation situation, and the present disclosure provides no limitation thereto.

Figure 6:
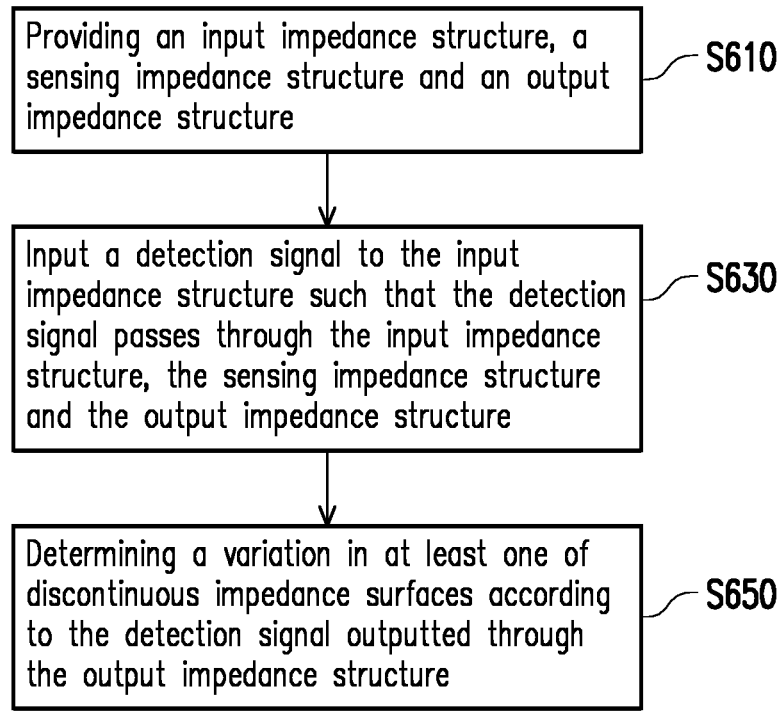
FIG. 6 is a flow chart of a detection method according to an embodiment of the disclosure.

FIG. 6 is a flow chart of a detection method according to an embodiment of the disclosure. Referring to FIG. 6, the detection apparatus 100 is configured and provided with the input impedance structure 120, the sensing impedance structure 130, and the output impedance structure 140 (step S610). The descriptions regarding the input impedance structure 120, the sensing impedance structure 130, and the output impedance structure 140 may be derived from FIG. 2-FIG. 5, and thus related details are omitted herein.

The signal generator 110 inputs the detection signal to the input impedance structure 120, so that the detection signal passes through the input impedance structure 120, the sensing impedance structure 130, and the output impedance structure 140 (step S630). Depending on the different electronic components or circuits that form the input impedance structure 120, the sensing impedance structure 130, and the output impedance structure 140, the signal generator 110 may generate different types of detection signals. For example, the sensing impedance structure 130 is formed by an inductance-capacitance (LC) circuit, and the detection signal is related to the current signal. The sensing impedance structure 130 is formed by a resistance-inductance (RL) circuit, and the detection signal is related to the voltage signal. The detection signal of the embodiment of the present disclosure is inputted to the input impedance structure 120, passes through the three structures 120-140, and is output from the output impedance structure 140.

Then, the processor 160 obtains the outputted detection signal, and may determine the variation of at least one of the discontinuous impedance surfaces according to the detection signal outputted through the output impedance structure 140 (step S650). In an embodiment, obtaining the outputted detection signal by the processor 160 may include obtaining the detection signal obtained through the analog to digital converter 150. In an embodiment, the processor 160 models an Infinite Impulse Response (IIR) filter structure according to the reflection characteristics of the discontinuous impedance surface and the relative position of the impedance of the sensing impedance structure 130. The reflection characteristic is related to the connection relationship of the IIR filter structure, and the relative position of the impedance is related to the delay coefficient of IIR filter structure.

Figure 7A:
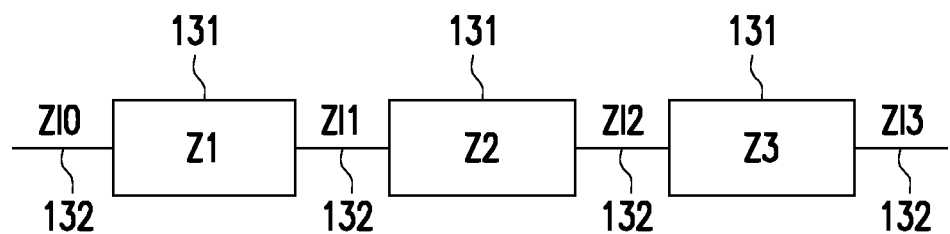
FIG. 7A-FIG. 7C are schematic views of a sensing impedance structure according to an embodiment of the present disclosure.
Figure 7B:
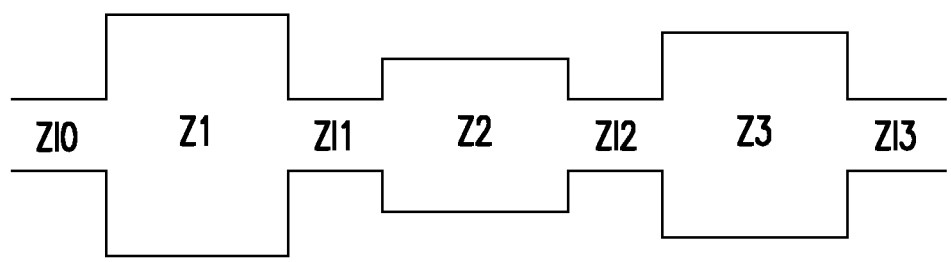
Figure 7C:
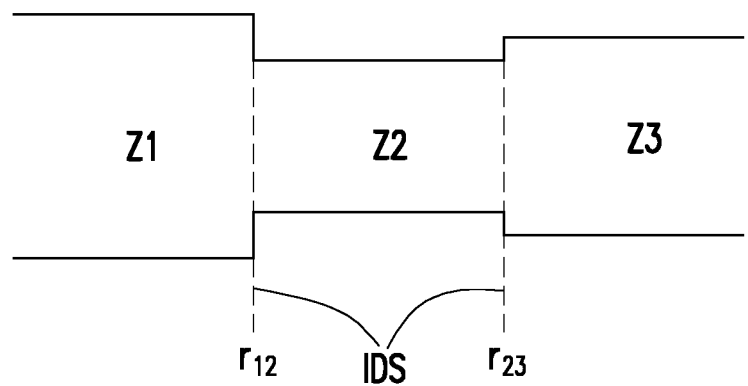

FIG. 7A-FIG. 7C are schematic views of a sensing impedance structure according to an embodiment of the present disclosure. Referring to FIG. 7A, taking the sensing impedance structure 130 as an example, it is assumed that there are three sensors 131 connected to each other in series through the connection wire 132. The corresponding impedances of the three sensors 131 are Z1, Z2, and Z3, and the corresponding impedances of the four connection wires 132 are ZI0 to ZI3. It is also assumed that the impedances Z1 to Z3 are discontinuous, that is, the impedance Z1 is not equivalent to the impedance Z2, and the impedance Z2 is not equivalent to the impedance Z3. It can be obtained from transmission theorem that the discontinuous impedance surface will cause reflection of input signal (i.e., reflection characteristics). Referring to FIG. 7B, described in the manner of fluid, the impedance may be converted into a plurality of multi-tubes of different tube diameters as shown in the drawing. If the impedances ZI0~ZI3 of the connection wire 132 are small enough to be negligible, the multi-tube may be formed as shown in FIG. 7C, and the discontinuous impedance surface IDS is formed between the impedance Z1 and the impedance Z2, and between the impedance Z2 and the impedance Z3. The reflective index between the impedance Z1 and the impedance Z2 is $r_{12}=(Z2-Z1)/(Z2+Z1)$, and the reflective index between the impedance Z2 and the impedance Z3 is $r_{23}=(Z3-Z2)/(Z3+Z2)$.

Figure 8A:
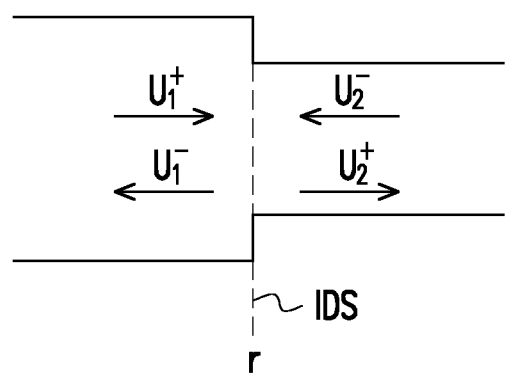
FIG. 8A-FIG. 8D are schematic views of structural conversion according to an embodiment of the present disclosure.

FIG. 8A-FIG. 8D are schematic views of structural conversion according to an embodiment of the present disclosure. Referring to FIG. 8A, firstly, considering the two-port network of a single discontinuous impedance surface IDS, and that the signal is partially reflected and partially penetrable when passing through the discontinuous impedance surface IDS. The reflection and penetration similarly occur to other discontinuous impedance surfaces IDS, such that signal is likely to be input to both sides of the single discontinuous impedance surface IDS. Assuming that the original signal is $U_1^+$ and $U_2^-$, and reflective index is r, then the scattered signal $U_1^-$ and $U_2^+$ can be obtained through the conversion matrix;

$$\begin{bmatrix} U_1^- \\ U_2^+ \end{bmatrix} = \begin{bmatrix} -r & 1-r \\ 1+r & r \end{bmatrix} \begin{bmatrix} U_1^+ \\ U_2^- \end{bmatrix} \quad (1)$$

Figure 8B:
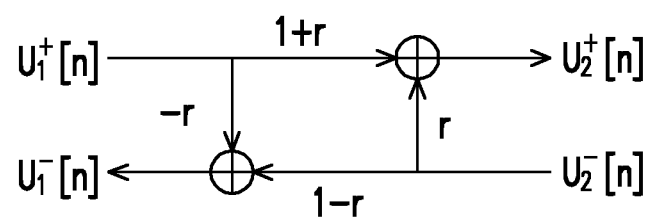

Referring to FIG. 8B, the above equation (1) may be converted into an equivalent circuit as shown in the drawing.

Figure 8C:
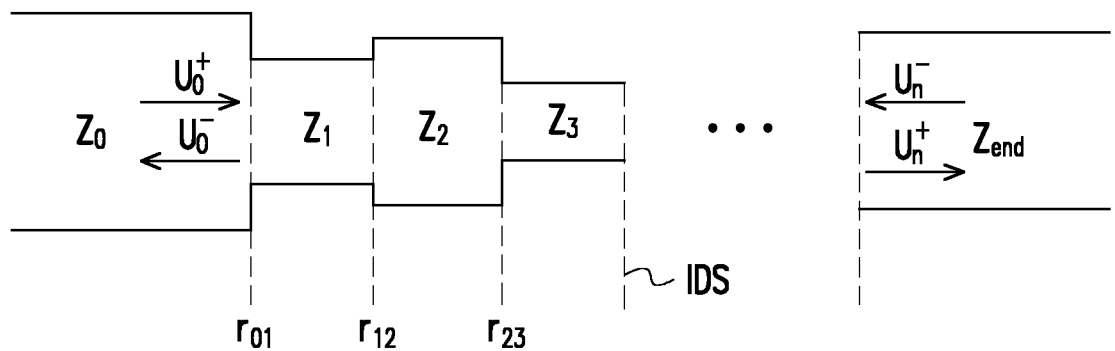
Figure 8D:
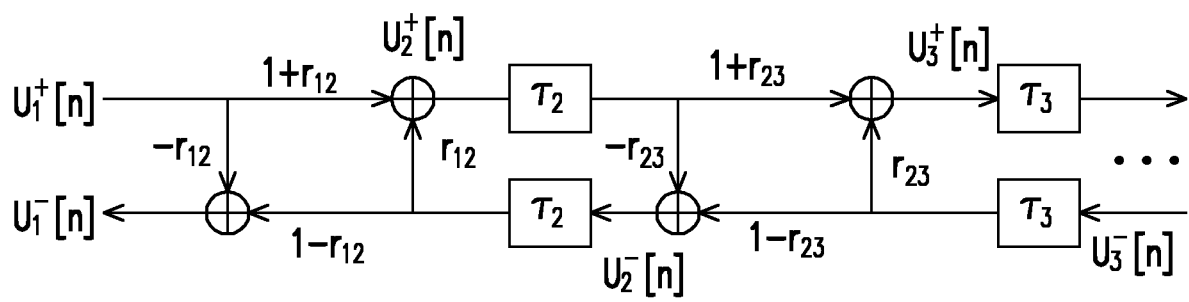

Referring to FIG. 8C, further considering more discontinuous impedance surfaces IDS, it is assumed that the impedance $Z_0$ is formed in the input impedance structure 120, and the impedance $Z_{end}$ is formed in the output impedance structure 140, and a plurality of impedances $Z_1$-$Z_3$ ... are formed in the sensing impedance structure 130. Each of the impedances is different from one or two adjacent impedances, thereby forming N discontinuous impedance surfaces IDS (assuming that the sensing impedance structure 130 includes N+1 impedances, and N is a positive integer). The reflective index between impedance $Z_0$ and impedance $Z_1$ is $r_{01}$, the reflective index between the impedance $Z_1$ and the impedance $Z_2$ is $r_{12}$ and so forth; the related descriptions are omitted herein. Based on the equation (1), the equivalent circuit as shown in FIG. 8D can be obtained (only a partial illustration is shown and the rest can be derived accordingly). $U_1^+$~$U_n^+$ and $U_1^-$~$U_n^-$ represent the input and output signals of each of the discontinuous impedance surfaces IDS. $\tau_2$~$\tau_3$ represent propagation delay and are related to relative position of impedance. For example, referring to FIG. 8C and FIG. 8D, before the signal is input to the impedance $Z_2$, the signal needs to pass through the discontinuous impedance surface IDS between the impedance $Z_0$ and the impedance $Z_1$, thereby forming a propagation delay $\tau_2$. In other words, the propagation delay is related to the relative position of any impedance relative to the previous adjacent impedance. Here, the basis for judgment of previous and latter is that after the signal is input from the input impedance structure 120, an impedance corresponding to signal output from the discontinuous impedance surface IDS between any two adjacent impedances is referred to previous one, and the impedance corresponding to signal input is referred to as latter one. Along with the signal passing through the impedance that falls further behind, more propagation delay will be accumulated relative to the time point passing through the impedance $Z_0$.

It can be seen from the above equivalent circuits shown in FIG. 8B and FIG. 8D that, for a single discontinuous impedance surface IDS, the output signal not only includes a part of the original input signal (the other part is reflected by the discontinuous impedance surface IDS), but also includes the previous output signal (penetrating back to the same discontinuous impedance surface IDS after being reflected). Such signal transmission structure is similar to an IIR filter structure. Assuming that the input and output function of the IIR filter structure is:

$$y(n) = \Sigma_{k=0}^{K} b_k x(n-k) - \Sigma_{l=0}^{L} a_l y(n-l) \quad (2)$$

y represents the output signal, x represents the input signal, $b_k$ represents the weight coefficient of the input signal, $a_l$ represents the weight coefficient of the output signal, K represents the feedforward level, and L represents the feedback level. Comparing with the equivalent circuit shown in FIG. 8D, it can be derived that the weight coefficients of the input and output signals are related to the reflective index. For example, the weight coefficient is $1+r_{12}$, $1+r_{23}$ and so forth. The propagation delay is related to the delay coefficient (function (2) is exemplified with the same delay unit (i.e., $Z^{-1}$)).

In an embodiment, the processor 160 models an equivalent IIR filter structure according to the reflection characteristics of the discontinuous impedance surface and the relative position of the impedance layout. If the processor 160 has already acquired the impedance values of the input impedance structure 120 and the output impedance structure 140 (e.g., the impedances $Z_0$ and $Z_{end}$ shown in FIG. 8C), the detection signals input to the input impedance structure 120, and the detection signal (has already passed through three structures 120-140) output from the output impedance structure 140, the processor 160 can determine the impedance value of each of the impedances in the sensing impedance structure 130.

In other words, the processor 160 can infer the weight coefficients in the equivalent circuit (i.e., the IIR filter structure) formed by the three structures 120-140 according to the Li Wensen Dubin algorithm. The weight coefficient is related to the reflective index of each discontinuous impedance surface, and the delay coefficient is designed by the three structures 120-140 and is known. Therefore, the processor 160 can utilize any algorithm (the Li Wensen Dubin algorithm is one of them, and other algorithms include, for example, inputting standard signals such as a specific step or a pulse and measuring response signal to estimate parameters such as the reflective index and the impedance, or use cyclic signal (larger than or equal to measuring points (i.e., the number of sensors)) of specific frequency and determine the amplitude or phase variation to infer each of the parameters) that can solve the IIR filter structure to determine the weight coefficient. The known weight coefficient can derive the reflective index of each of the discontinuous impedance surfaces, and the known reflective index of each of the discontinuous impedance surface can derive the unknown impedance in the sensing impedance structure 130.

The detection apparatus 100 may transmit the detection signal through the signal generator 110 before the subsequent sensing operation (the sensor 131 in the sensing impedance structure 130 has not generated variation in reaction to the external object or the external medium). The detection signal will pass through the three structures 120-140 and will be outputted to the analog to digital converter 150, and the processor 160 can obtain the digital output detection signal. Then the processor 160 estimates an unknown original impedance value in the sensing impedance structure 130 according to the known impedance value of the input impedance structure 120 and the output impedance structure 140 and the inputted and outputted detection signals. In the subsequent sensing operation, the processor 160 can use these original impedance values as a basis for comparison.

In an embodiment, the processor 160 may determine a comparison result of the impedance value of the sense impedance structure 130 with the original impedance value according to the variation in at least one of the discontinuous impedance surfaces. The signal generator 110 transmits the detection signal regularly or irregularly, and the processor 160 determines regularly or irregularly whether the reflective index corresponding to each of the discontinuous impedance surfaces is changed according to the received output detection signal. If any of the reflective index is changed, it represents that there is a difference in the comparison result of the impedance value of the current sense impedance structure 130 and the original impedance value. If any of the reflective index is not changed, it represents that there is no difference in the comparison result of the impedance value of the current sense impedance structure 130 and the original impedance value.

In an embodiment, the processor 160 can determine the variation of the adjacent impedances of discontinuous impedance surface according to the variation of the reflective index (i.e., difference in weight coefficient) on the discontinuous impedance surfaces (the reflective index is the ratio of addition of the adjacent impedances to subtraction of adjacent impedances), thereby obtaining the physical detection value (e.g., through looking up table or inputting equation) corresponding to the sensor 131 according to the variation of impedance, such as the level of pressure, hardness, and the like. In another embodiment, the processor 160 may also determine the variation of the adjacent impedance of the discontinuous impedance surface according to the variation of the reflective index on the discontinuous impedance surfaces, thereby obtaining the position (e.g., through looking up table or inputting equation) corresponding to the sensor 131 on the sensing impedance structure 130 according to the changed impedance. For example, the corresponding position of one or more of the sensors 131 is touched by an external object or has a different hardness.

Therefore, the embodiment of the present disclosure can design a plurality of known discontinuous impedance surface (formed by different adjacent impedances in the equivalent circuit) in advance, and then determine which discontinuous impedance surface is changed according to the variation of the output signal (input signal passes through each of the structures 120-140), thereby obtaining information such as position or physical detection value and so on. There are many scenarios to which the embodiments of the present disclosure can be applied. For example, for a touch panel, if there is a need to deploy more than a certain number of sensors 131, each of the sensors 131 only needs to be connected in series (as shown in FIG. 4) and formed into a matrix shape, and no additional connection wire 132 is required to be connected between the sensor 131 and the signal generator 110 or between the sensor 131 and the analog to digital converter 150. For the soil ingredient analysis, or the power line defect detection, the sensing impedance structure 130 may also be formed in a serial manner to determine the difference in soil ingredient or the defect of power wire. Since the circuit traces or the number of wires are simplified, the detection apparatus of the embodiment of the present disclosure may also be applied as a flexible soft pressure sensing apparatus (for example, a soft touch panel, mechanical finger touch sensing, soft electronic skin, robot arm, smart insoles, smart sheets, etc.) for multi-point detection.

In summary, the detection apparatus and the detection method thereof described in the embodiments of the present disclosure design the input impedance, the sensing impedance and output impedance structures connected in series in advance depending on different requirement of design, and the adjacent impedances in the impedance structures are different, thereby forming the discontinuous impedance surface. Based on the penetration and reflection characteristics of the discontinuous impedance surface and the relative position of the impedance, an IIR filter structure can be modeled. Then, by using the IIR filter structure to infer the reflective index of the discontinuous impedance surface and the impedances, it is possible to obtain the variation of discontinuous impedance surface or each impedance in response to the subsequent detection operation, thereby obtaining the related information such as position or physical sensing values and so on. The embodiments of the present disclosure can greatly simplify the number of wire arrangement and can be applied to sensing device for multi-point detection and/or flexibility requirements.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A detection method, comprising:
providing an input impedance structure;
providing a sensing impedance structure, wherein the sensing impedance structure is connected to the input impedance structure, and at least two impedances are formed in the sensing impedance structure;
providing an output impedance structure, wherein the output impedance structure is connected to the sensing impedance structure, and at least three discontinuous impedance surfaces are formed by the input impedance structure, the sensing impedance structure, and the output impedance structure;
inputting a detection signal to the input impedance structure such that the detection signal passes through the input impedance structure, the sensing impedance structure, and the output impedance structure; and
determining a variation in at least one of the discontinuous impedance surfaces according to the detection signal outputted through the output impedance structure, wherein an infinite impulse response (IIR) filter structure is modeled according to a reflection characteristic of the at least three discontinuous impedance surfaces and a relative position of impedance of the sensing impedance structure, the reflection characteristic is related to a weight coefficient of the IIR filter structure, and the relative position of the impedance is related to a delay coefficient of the IIR filter structure.

2. The detection method of claim 1, wherein the step of determining the variation in the at least one of the discontinuous impedance surfaces according to the detection signal outputted through the output impedance structure comprises:
providing impedance values of the input impedance structure and the output impedance structure;
determining an impedance value of the sensing impedance structure according to the impedance values of the input impedance structure and the output impedance structure, the inputted detection signal and the outputted detection signal; and
determining a comparison result of the impedance value of the sensing impedance structure and an original impedance value according to the variation in the at least one of the discontinuous impedance surfaces, wherein the original impedance value of the sensing impedance structure is related to not reacting to an external object or an external medium.

3. The detection method of claim 2, wherein the step of determining the impedance value of the sensing impedance structure according to the impedance values of the input impedance structure and the output impedance structure, the inputted detection signal and the outputted detection signal comprises:
determining reflection characteristics of the at least three discontinuous impedance surfaces by using a Levinson Durbin algorithm with the impedance values of the input impedance structure and the output impedance structure, and the inputted detection signal and the outputted detection signal.

4. The detection method of claim 1, wherein the step of determining the variation in the at least one of the discontinuous impedance surfaces according to the detection signal outputted through the output impedance structure comprises:
determining at least one physical detection value according to the variation of the at least one of the discontinuous impedance surfaces.

5. The detection method of claim 1, wherein the step of determining the variation in the at least one of the discontinuous impedance surfaces according to the detection signal outputted through the output impedance structure comprises:
determining a corresponding position on the sensing impedance structure according to the variation of the at least one of the discontinuous impedance surfaces.

6. The detection method of claim 1, wherein the step of providing the sensing impedance structure comprises:
providing a plurality of sensors connected in series to form the sensing impedance structure, wherein an impedance value of each of the sensors is different from an impedance value of an adjacent path or another adjacent one of the sensors.

7. The detection method of claim 6, wherein the sensors are pressure sensors or softness sensors.

8. A detection apparatus, comprising:
an input impedance structure;
a sensing impedance structure, wherein the sensing impedance structure is connected to the input impedance structure, and at least two impedances are formed in the sensing impedance structure;
an output impedance structure, wherein the output impedance structure is connected to the sensing impedance structure, at least three discontinuous impedance surfaces are formed by the input impedance structure, the sensing impedance structure, and the output impedance structure;
a signal generator, connected to the input impedance structure and inputting a detection signal to the input impedance structure such that the detection signal passes through the input impedance structure, the sensing impedance structure and the output impedance structure; and
a processor, determining a variation in at least one of the discontinuous impedance surfaces according to the detection signal outputted through the output impedance structure, wherein the processor models an infinite impulse response (IIR) filter structure according to a reflection characteristic of the at least three discontinuous impedance surfaces and a relative position of impedance of the sensing impedance structure, the reflection characteristic is related to a weight coefficient of the IIR filter structure, and the relative position of the impedance is related to a delay coefficient of the IIR filter structure.

9. The detection apparatus of claim 8, wherein the processor obtains impedance values of the input impedance structure and the output impedance structure, determines an impedance value of the sensing impedance structure according to the impedance values of the input impedance structure and the output impedance structure, the inputted detection signal and the outputted detection signal, and determines a comparison result of the impedance value of the sensing impedance structure and an original impedance value according to the variation of the at least one of the discontinuous impedance surfaces, wherein the original impedance value of the sense impedance structure is related to not reacting to an external object or an external medium.

10. The detection apparatus of claim 9, wherein the processor determines reflection characteristics of the at least three discontinuous impedance surfaces by using a Levinson Durbin algorithm with the impedance values of the input impedance structure and the output impedance structure, the inputted detection signal and the outputted detection signal.

11. The detection apparatus of claim 8, wherein the processor determines at least one physical detection value according to the variation of the at least one of the discontinuous impedance surfaces.

12. The detection apparatus of claim 8, wherein the processor determines a corresponding position on the sensing impedance structure according to the variation of the at least one of the discontinuous impedance surfaces.

13. The detection apparatus of claim 8, wherein the sensing impedance structure comprises a plurality of sensors connected in series, and an impedance value of each of the sensors is different from an impedance value of an adjacent path or another adjacent one of the sensors.

14. The detection apparatus of claim 13, wherein each of the sensors is only connected to another adjacent one of the sensors, the adjacent input impedance structure, or the adjacent output impedance structure.

15. The detection apparatus of claim 13, wherein the sensors are pressure sensors or softness sensors.

* * * * *